Figure 1:
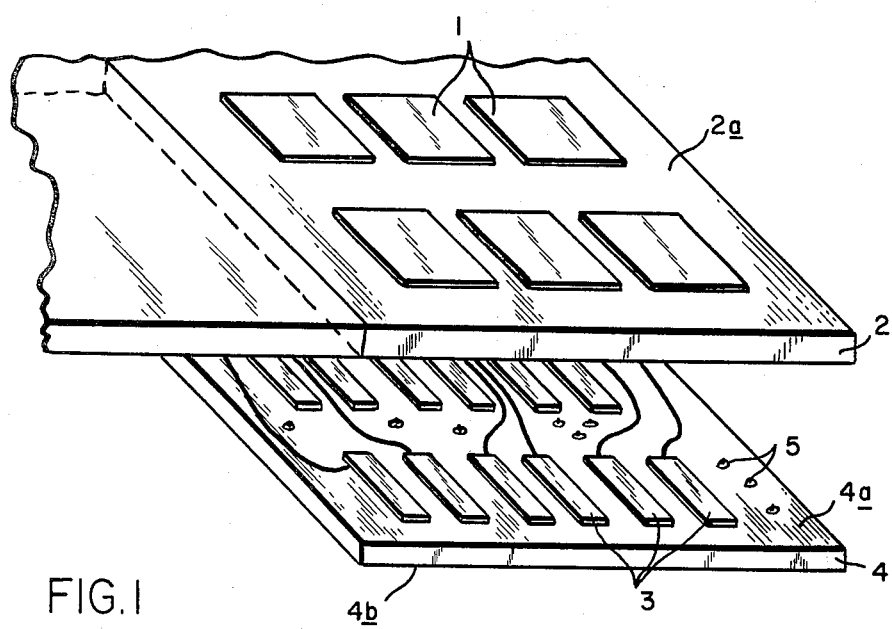

United States Patent [19]

Pretzsch

[11] 4,224,493
[45] Sep. 23, 1980

[54] CONTACT SWITCH ARRANGEMENT

[76] Inventor: Siegfried Pretzsch, Dürerstrasse 21a, D-5657 Haan, Fed. Rep. of Germany

[21] Appl. No.: 972,376

[22] Filed: Dec. 22, 1978

[51] Int. Cl.$^3$ .................. H01H 9/00; H05K 1/00
[52] U.S. Cl. .................. 200/292; 174/68.5; 339/17 M; 339/17 R
[58] Field of Search .......... 200/292; 174/68.5; 339/17 A, 17 R

[56] References Cited

U.S. PATENT DOCUMENTS

| 2,854,552 | 9/1958 | Gouverneur | 200/292 X |
|---|---|---|---|
| 3,549,784 | 12/1970 | Hargis | 174/68.5 |
| 3,562,009 | 2/1971 | Cranston et al. | 174/68.5 |
| 3,569,790 | 3/1971 | Jenik | 339/17 M |
| 3,571,489 | 3/1971 | Coale | 174/68.5 |
| 3,819,430 | 6/1974 | Dugan | 174/68.5 |
| 4,029,375 | 6/1977 | Gabrielian | 339/17 M |
| 4,110,904 | 9/1978 | Johnson | 339/17 R X |

*Primary Examiner*—Steven M. Pollard
*Attorney, Agent, or Firm*—Thompson, Birch, Gauthier & Samuels

[57] ABSTRACT

A contact switch arrangement consisting of metal alloys evaporation- deposited within position pressure areas on the front of a glass pane and contacting surfaces situated opposite to these on the back of the pane which are conductively connectable with switch elements of the carrier plate of a printed circuit.

6 Claims, 3 Drawing Figures

CONTACT SWITCH ARRANGEMENT

The invention relates to a contact switch arrangement, consisting of metal alloys evaporation-deposited within position pressure areas on the front of a glass pane and contacting surfaces situated opposite to these on the back of the pane which are conductively connectable with switch elements of the carrier plate of a printed circuit.

In known contact switch arrangements of this kind the carrier plate of the printed circuit is fitted non-displaceably in a mounting at a distance from the back of the glass pane and the conductive connection between the carrier plate and the switch elements situated thereon is effected by contact springs secured on the plate which bridge over the distance between the two plates and rest on the contacting surfaces of the back of the glass pane.

Apart from the difficulty caused by the fitting of the necessary numerous springs on the carrier plate and the space requirement of the fastening, which is not available for conductors and switch elements of the carrier plate, these known switch arrangements also involve the substantial disadvantage of great production expense necessary for the fitting of the contacting surfaces on the back of the glass pane. This expense is especially great when refractory glass or ceramic plates are concerned such as are used for example as heating and cooking plates. The great production expense, for economic reasons, also in this case requires correspondingly large production numbers of one and the same arrangement of the contacting surfaces on the pane.

The invention is based upon the problem of avoiding the mentioned difficulties and eliminating the disadvantages. This problem is solved in that the contacting surfaces are arranged not on the back of the glass or ceramic pane but on the back of the carrier plate of the printed circuit, and the carrier plate can be applied with this back to the back of the glass plate and pressed against the latter by means of resilient presser elements.

In this way the contacting surfaces can be fitted with well proven and known techniques to the carrier plate of the printed circuit itself and the glass plate needs only the provision of the position pressure areas with the evaporation deposited metal alloy on its front. The contacting surfaces fitted on the carrier plate of the printed circuit, due to the application and pressing of the carrier plate in exactly the same position upon the under side of the glass pane, replace the contacting surfaces hitherto applied to the back of the glass pane with considerable production expense. In contrast to these however they can at any time be removed therefrom by removal of the carrier plate, and replaced by others.

The presser elements for the carrier plate can consist of spring pins which engage beneath the carrier plate in nonconductive zones of the carrier plate surface placed close to the contacting surfaces. To avoid the possibility of solder spots or conductors situated beside the contacting surfaces likewise on the back of the carrier plate being pressed against the under side of the glass plate, as the invention further provides the contacting surfaces can be fitted on spacer plates of conductive or non-conductive material, the thickness of which is greater than the height of the solder spots or conductors.

Finally in accordance with the invention the possibility also exists of the carrier plate and glass pane being stuck to one another in the condition laid one upon the other.

The invention will be explained in greater detail with reference to the example of embodiment which is illustrated in the drawing, wherein:-

Figure 2:
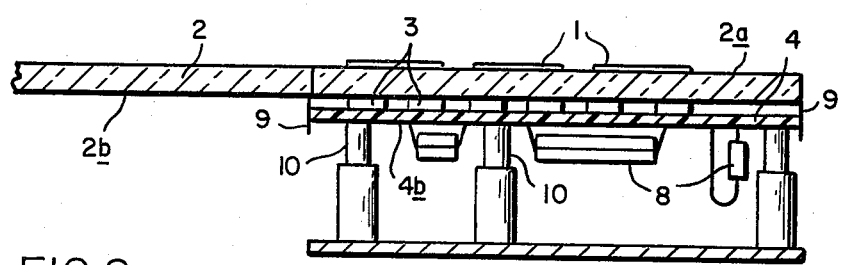
Figure 3:
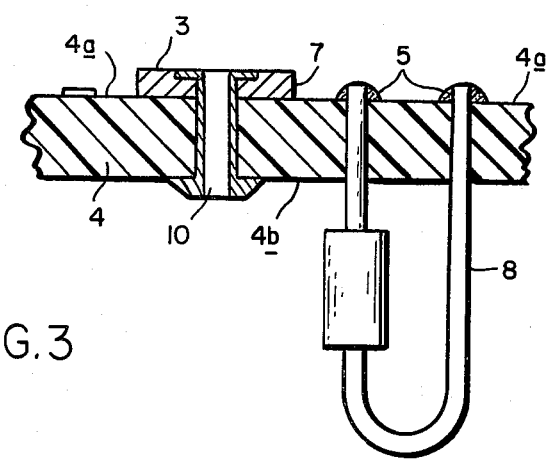

FIG. 1 shows the switch arrangement, in the separated condition, inperspective representation, FIG. 2 shows the switch arrangement in the operational position in section, seen from one side, and FIG. 3 shows a section through the carrier plate on an enlarged scale.

As may be seen from FIG. 1, the positioning pressure areas 1 are arranged on the front 2a of the glass or ceramic plate 2. The contacting surfaces 3 are situated on the back 4a of the carrier plate 4 of the printed circuit. The conductors and the switch elements of the printed circuit are arranged on the front 4b (not visible in FIG. 1) of the carrier plate and only the solder spots 5 of this circuit are situated between the contacting surfaces 3 on the back 4a of the carrier plate 4.

FIG. 2 shows how the carrier plate 4, secured against lateral shifting by guide plates 9, is pressed against the under side of the glass plate 2, with the contacting surfaces 3 resting against this under side, by means of the spring pins 10 which engage beneath the front 4b in the non-conductive zones between the switch elements 8.

FIG. 3 shows that the contacting surfaces 3 are here fitted on spacer plate 7 which have been secured here on the carrier plate 4 by means of a hollow rivet 10. The thickness of the spacer plate 7 is greater than the height of the solder spots 5 for the switch elements 8 indicated beside this plate 7.

I claim:

1. A contact switch arrangement which comprises
   (a) a first plate having a back side and a front side with metal alloys deposited on the front side within position pressure areas;
   (b) a carrier plate of a printed circuit having a back side and a front side, the back side having contacting surfaces thereon conductively connectable with switch elements of the carrier plate of the printed circuit; and
   (c) resilient pin means in contacting engagement with the front of the carrier plate to bias the carrier plate outwardly, the backs of the first plate and the carrier plate in contacting engagement, the metal alloys in register with the contacting surfaces.

2. The arrangement of claim 1 wherein the resilient pin means comprise
   spring pins which engage the front of the carrier plate in nonconductive zones.

3. The arrangement of claim 2 wherein the spring pins are positioned adjacent to the contacting surfaces.

4. The arrangement of claims 1,2 or 3 which includes spacer plates to maintain the contacting surfaces spaced apart from the back surface of the carrier plate.

5. The arrangement of claim 4 which includes means to prevent lateral displacement of the first plate relative to the carrier plate when in assembled relation.

6. The arrangement of claim 4 wherein the plates are secured one to the other in overlaying relationship.

* * * * *